United States Patent [19]

Way et al.

[11] 4,074,272

[45] Feb. 14, 1978

[54] SPECTROPHOTOMETER HAVING INDEPENDENTLY CONTROLLED CHART SCALE EXPANSION AND CHART FORMAT SELECTION

[75] Inventors: Allan S. Way; Thomas J. Glenn, both of Irvine; Howard J. Sloane, Fullerton; Gerald T. Keahl, Newport Beach, all of Calif.

[73] Assignee: Beckman Instruments, Inc., Fullerton, Calif.

[21] Appl. No.: 656,463

[22] Filed: Feb. 9, 1976

Related U.S. Application Data

[63] Continuation of Ser. No. 443,631, Feb. 19, 1974, abandoned.

[51] Int. Cl.$^2$ .......................... G01D 5/26; G01D 9/38
[52] U.S. Cl. .................................... 346/33 A; 346/65; 346/136; 356/96
[58] Field of Search ................ 346/33 A, 65, 32, 136; 324/100, 99; 356/96, 97, 98

[56] References Cited

U.S. PATENT DOCUMENTS

| | | | |
|---|---|---|---|
| 2,656,498 | 10/1953 | Goodwin | 346/32 X |
| 2,945,997 | 7/1960 | Kennedy | 346/136 X |
| 3,019,072 | 1/1962 | Bose et al. | 346/139 B X |
| 3,063,043 | 11/1962 | Coates | 346/33 A X |
| 3,563,656 | 2/1971 | Helms | 356/96 |

Primary Examiner—Joseph W. Hartary
Attorney, Agent, or Firm—Robert J. Steinmeyer; Robert R. Meads; John R. Shewmaker

[57] ABSTRACT

A variable chart format system for a recorder with a chart print out, the system having a manually selectable switch for simultaneously controlling the abscissa and ordinate formatting independent of scale expansion circuitry normally associated with the abscissa and ordinate. The abscissa formatting is digital and operable in response to a programmable or variable clock, the output of which is selectively passed through a first set of abscissa formatting frequency dividers and then serially through one of a second set of abscissa scale expansion frequency dividers to drive a chart drive stepper motor. The ordinate formatting is analog and includes ordinate scale expansion circuitry in series with the servomotor and ordinate formatting selectable compensating resistors in series with the recording pen potentiometer or slidewire, the selectable compensating resistors being selected simultaneously with the abscissa formatting dividers to thereby preselect a chart format by a single control without affecting the abscissa or ordinate expansion circuitry.

2 Claims, 3 Drawing Figures

SPECTROPHOTOMETER HAVING INDEPENDENTLY CONTROLLED CHART SCALE EXPANSION AND CHART FORMAT SELECTION

This is a continuation of application Ser. No. 443,631, filed Feb. 19, 1974, now abandoned.

BACKGROUND OF THE INVENTION

1. Cross-Reference to Related Applications

This application is related to the following application assigned to the assignee of the instant invention:

U.S. patent application Ser. No. 433,396 entitled "Stepper Motor Tracking Accuracy Control" by Allan S. Way and Stanley L. Pratt, filed Jan. 14, 1974, now U.S. Pat. No. 4,000,946; and U.S. patent application Ser. No. 433,397 entitled "Voltage Variab. Digital Clock" by Allan S. Way and filed Jan. 14, 1974, now U.S. Pat. No. 3,895,315.

2. Field of the Invention

This invention relates to chart recording systems, and more particularly to chart recording systems utilized with spectrophotometer or optical density measuring systems.

In spectrophotometer systems as shown and described in the above-identified related applications, an optical characteristic of a sample is measured to provide a signal indicative of the optical characteristic. Although the above-identified applications relate to an optical null infrared spectrophotometer, it is to be understood the principles hereinafter described are equally applicable to an optical system such as an ultraviolet spectrophotometer having a single beam path and a detector.

In either instance a wavelength scanning device is utilized to transmit light of differing wavelengths through the sample to provide an output through the system indicative of the optical characteristic which may be absorbance or transmittance, this output then being recorded as a spectrum of wavenumber or wavelength (abscissa) versus optical characteristic (ordinate) on a chart paper. There are many manufacturers of such instruments and various manufacturers utilize differing chart sizes and formats for the output, some of the charts being dimensioned in metric units and others being dimensioned in English units. In the usual situation where a user already has a particular spectrophotometer, he has derived a standard set of charts or spectrograms giving spectral analysis for known samples. The user then utilizes the standard charts for comparison purposes against unknown samples. In the instance where an operator or user has a particular set of standard charts derived from a given instrument, he is unable to draw a direct comparison with a spectrum derived from another manufacturer's instrument on a one-to-one relation basis if the latter manufacturer's charts employ a different format. Thus, if he utilizes another manufacturer's instrument, he is then required to run a new set of standard charts on known samples for comparison with unknown samples later analyzed on the same instrument.

Furthermore in such instruments the manufacturers provide abscissa scale expansion circuitry as well as ordinate scale expansion circuitry. However, this does not provide the user with the flexibility desired inasmuch as the abscissa scale expansion circuitry is normally desired for use when the spectrum is a given portion of the chart within a certain wavenumber range contains such high density information that certain peaks are not discernible; the user then has the option of selecting an expansion number such as "1X", "2X", etc., which merely drives the chart twice as fast on "2X", thereby spreading out the crowded portion of the spectrum. Similarly, on the ordinate scale, the ordinate expansion is intended to utilize the full Y-axis of the chart paper to provide a magnified version of a portion of the spectrum on the Y-axis in a selected range such as 50 to 100% transmittance, 80 to 100% transmittance or the like. Neither of these scale expansions utilized separately or in conjunction can resolve the problem associated with the various chart sizes and formats in English or metric units of various manufacturers.

SUMMARY OF THE INVENTION

Accordingly, it is an object of this invention to provide a new and improved recording chart system having variable chart formatting capability.

It is another object of this invention to provide a variable chart formatting system manually selectable and electrically operable by a single control, the variable chart formatting being independent of scale expansion circuitry.

It is a further object of this invention to provide digital abscissa formatting independent of the abscissa scale expansion circuitry.

It is a still further object of this invention to provide analog ordinate formatting independent of the ordinate scale expansion circuitry of a chart recording system.

The foregoing and other objects of the invention are accomplished by providing a system clock having a train of pulses output to simultaneously operate a wavelength drive stepper motor and a chart drive stepper motor. The output of the clock is transmitted through scan speed dividers which are switch selectable to predetermined scan speeds. The output of the scan speed dividers is transmitted simultaneously to a wavelength drive stepper motor and to a first set of frequency dividers forming abscissa formatting circuit. Any one of the first set of frequency dividers can be placed in series through a first switch with abscissa scale expansion circuitry. The abscissa scale expansion circuitry includes a second set of frequency dividers, any one of which can be switch selected in series with the chart motor driver for driving the chart drive stepper motor. The first set of frequency dividers are preselected according to the conversion desired for abscissa formatting.

The ordinate expansion circuitry, ordinarily includes a marker or pen position sensing means such as a slidewire resistor, the slidewire resistor ordinarily having one end thereof connected to a known negative voltage source and the other end thereof connected to a known positive voltage source of equal magnitude. For ordinate formatting, interposed in series between the two sources of voltage is a set of series resistors switch-selectable to place a predetermined value of resistance in series with the slide wire between the two sources of potential, thus controlling the current through the slidewire. The switch is coupled mechanically to the switch associated with the first set of dividers for simultaneous actuation of both switches to predetermined locations associated with a predetermined chart format.

The novel features which are believed to be characteristic of the invention are set forth with particularity in the specification which can best be understood by reference to the following description taken in conjunction with the accompanying drawings.

DESCRIPTION OF THE PREFERRED EMBODIMENT

Figure 1:
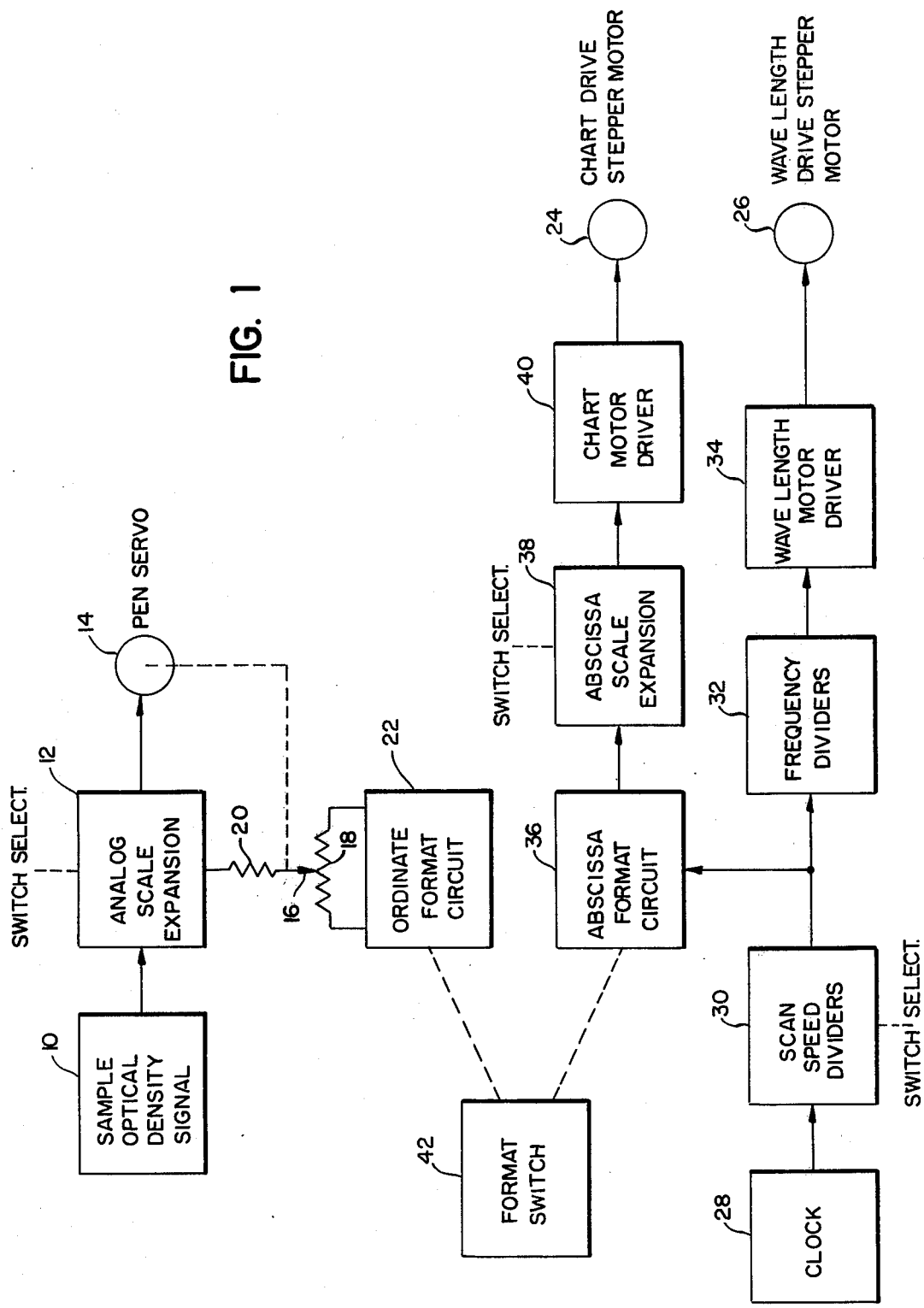
FIG. 1 is a block diagram of a spectrophotometer chart recording system in accordance with the instant invention.

Referring to the drawings, and more particularly to FIG. 1, there is shown a block diagram of a portion of a radiant energy analyzer such as a spectrophotometer. In spectrophotometry an optical characteristic of a sample is measured, which may be, for example, in the case of ultraviolet spectrophotometry, the absorbance, and in infrared spectrophotometry this may be the percent transmission of light through the sample. In either event a signal is derived, which signal is proportional to the optical density of the sample and as shown in block 10 is referred to as the sample optical density signal. In ultraviolet spectrophotometry this signal may be derived as a function of the output of a detector tube while in an optical null infrared spectrophotometer having a beam attenuator such as a comb in the reference beam path, the optical density signal may be proportional to the comb or attenuator position.

This signal may be utilized to drive the analog ordinate scale expansion circuitry 12 which is switch-selectable to provide varying ranges of percentage of optical density desired at the output to in turn drive the recording pen servomotor 14. The pen servomotor is mechanically coupled to a movable tap 16 of a voltage dividing device such as slidewire resistor 18 to give a variable voltage output back to the analog scale expansion circuitry 12 through a series resistor 20. The servo motor 14 operates on an error voltage derived in a conventional manner by comparing the actual pen position with the desired position indicated by the input. Ordinarily the ends of the slidewire resistor 18 are coupled across a known source of d.c. voltage with the slidewire 16 acting as a voltage tap. In this particular system, an ordinate format circuit 22, as will be hereinafter discussed, selectively determines the full scale voltage across the slidewire resistor 18. The ordinate effectively represents the pen position or amplitude of the sample optical characteristic signal along the Y-axis of a chart paper while the abscissa is indicative of the wavenumber along the X-axis when either the chart is being moved with respect to the pen or the chart is stationary and the pen mechanism itself is being moved along the X-axis.

In a recording spectrophotometer the chart motor 24 must be maintained in a precise known ratio to the wavelength drive motor 26 and in the instant embodiment this is accomplished through the clock 28 which puts out a train of pulses of a constant frequency to a scan divider circuit 30 which is switch selectable to predetermined scan speeds to effect simultaneous control of the chart motor 24 and wavelength drive motor 26. The output of the scan speed divider 30 is transmitted through a frequency divider 32, through a wavelength motor driver 34 to drive the wavelength drive motor 26. The output of the scan speed dividers 30 is also transferred through the abscessa format circuit 36 through an abscissa scale expansion circuit 38 which is switch-selectable to the chart motor driver 40 to control the speed of the chart motor 24. The abscissa format circuit 36 and the ordinate format circuit 22 are simultaneously controlled by a single format switch 42.

As previously mentioned, since various manufacturers utilize chart formats which are different from other manufacturers, this results in a spectral analysis waveform or spectrogram printed out on one recording instrument being inconvenient and awkward to compare against another manufacturer's instrument unless that other instrument utilizes the same chart format. By appropriate selection of components, the format switch 42 can be instantaneously set to a given position to yield a spectral format for spectrogram comparison in accordance with a preselected chart format. This is done electrically without gear changes or the need for mechanical clutches.

Figure 2:
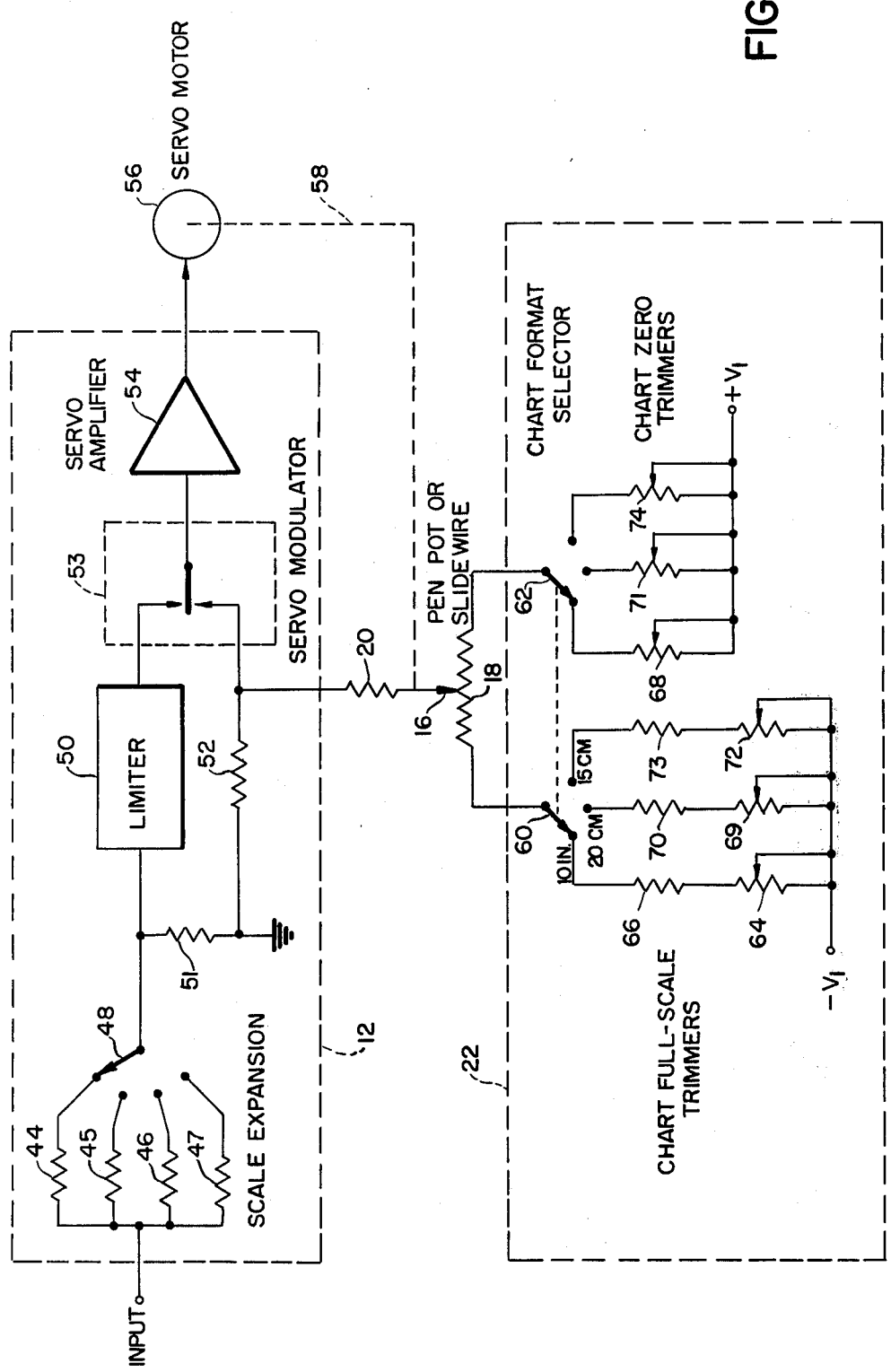
FIG. 2 is a partially block, partially schematic diagram of the ordinate circuitry of FIG. 1.

Referring now to FIG. 2, there is shown the analog ordinate formate circuitry 22 and the ordinate scale expansion circuitry 12 which is independent therefrom. The scale expansion circuitry 12 receives the input signal 10 which is passed through one of a set of switch selectable resistors 44, 45, 46 and 47 in series path through the switch 48, with the switch position designations 0–100, 50–100, 80–100 and 90–100 being indicative of the percentage transmission range selectable for scale expansion and printout on the ordinate of the chart paper. The resistors are essentially voltage dropping resistors, which form one leg of a voltage divider which includes resistor 51. The voltage divided output provides the input to limiter 50. The output of limiter 50 is coupled to one input terminal of chopper or servo modulator 53. The chopper, in conventional fashion, provides a signal to a servo amplifier 54 which controls the servomotor 56 to drive the pen, the position of which is detected by means of a mechanical linkage 58 which drives the center tap 16 of the slidewire resistance 18 to provide a voltage output through a voltage divider comprising resistor 20 and resistor 52, thereby providing a voltage signal to a second input terminal of the chopper 53. Ordinarily, the slidewire resistor 18 would be connected across a known fixed source of voltage. However, by the addition of the ordinate format circuit 22, the ends of the slidewire resistor 18 are coupled through a double pole three position switch having a first arm 60 connected to one end of the slidewire resistor 18 and a second arm 62 connected to the other end of the slidewire resistor 18.

With the double pole switch in the position shown in FIG. 2, the current flow through slidewire resistor 18 is as follows: from a negative source of voltage $-V_1$ (which may be, for example, 15 volts ) current flows through a first adjusting resistor 64 through a fixed resistor 66, through switch 60, through slidewire resistor 18, through switch 62, through a variable resistor 68 to a positive source of voltage $+V_1$. Resistor 68 is a trimming resistor to establish a chart zero reference while resistor 64 is a trimming resistor to establish chart full scale for the particular series selected resistor 66. The switch 60, 62 may be also positioned at a second position to place resistors 69, 70 and 71 in series with the slidewire resistor 18, or a third switch position to place resistors 72, 73 and 74 in series with slidewire resistor 18. The value of resistors 68, 71 and 74 for trimming to a chart zero position are essentially identical and of low resistive value. Resistors 66, 70 and 73 have different values and are preselected to establish the maximum distance of travel of the pen along the Y-axis of the chart in a format preselected according to the desired chart format. For example, the position in which the switch 60, 62 is shown can correspond to ten inches of pen movement on the Y-axis, the second position can correspond to 20 centimeters and a third position can correspond to 15 centimeters according to the value of resistance selected. By appropriate selection of the values of these resistors a conversion from inches of travel to centimeters of travel can be accomplished to accommodate various chart formats.

While there have been shown only three switch postions, it is to be understood that additional switch selectable resistors can be added for other desired distances of travel along the Y-axis of the chart.

Figure 3:
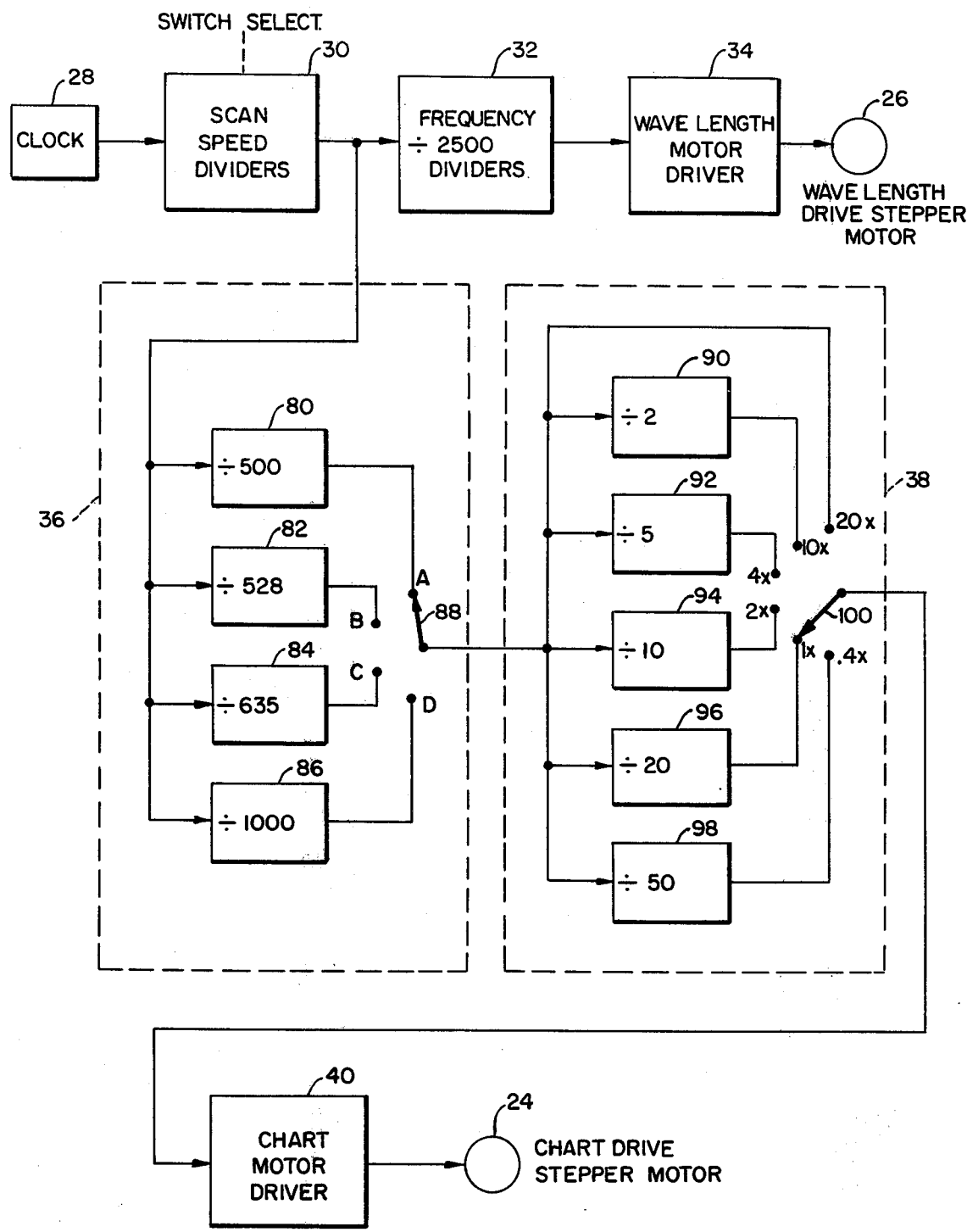
FIG. 3 is a block diagram of the abscissa circuitry utilized in the system of FIG. 1.

Referring now to FIG. 3 there is shown the digital abscissa format circuitry 36 and the abscissa scale expansion circuitry 38 which is independent therefrom. The abscissa format circuit is shown in dotted lines at numeral 36 while the abscissa scale expansion circuitry is shown in dotted lines at 38. A system clock 28 provides a train of pulses at its output at a frequency, for example, of approximately 800 Khz, which corresponds to a scan speed of approximately 1,000 wavenumbers per minute at the wavelength drive stepper motor 26. The output of clock 28 is passed through a scan speed divider 30 which is switch selectable to any one of a plurality of scan speeds less than the maximum wavenumber scan speed permitted by the clock 28. The output of the scan speed divider is transmitted simultaneously to a fixed frequency divider 32 and to the abscissa format circuit 36. The fixed frequency divider 32 can be a conventional "divide by 2500" divider to provide a suitable output frequency to the stepper motor 26. The output of frequency divider 32 is passed through the wavelength motor driver 34 to suitably control the wavelength drive stepper motor 26.

The output of the scan speed divider 30 is also transmitted to the abscissa format circuit 36 which places one of a plurality of frequency dividers 80, 82, 84 or 86 in series therewith. The particular divider selected is determined by the position of switch 88 which has positions determined by the position of switch 88 which has positions designated "A", "B", "C", and "D", each position being indicative of a predetermined measurement of wavenumbers/linear unit (i.e. centimeters or inches). The numeral designatiions within the frequency dividers 80 give representative examples of frequency divisions which can be utilized for a first frequency division in accordance with preselected chart formats. To illustrate, the frequency divider 80 (position "A") has a "divide by 500" capability while frequency divider 84 (position "C") has a "divide by 635" capability. The ratio between these numbers is approximately 2:2.54. With switch 100 set to "1X" and switch 88 set to the "A" position, with the the proper frequency from clock 28, switch 86 can be indicative of an abscissa chart format of 100 wavenumbers per inch. By switching to the "C" position, with all else constant, the format would then be 50 wavenumbers per centimeter, thus effecting an English unit to metric unit conversion without a change of gearing. The switch 88 of the abscissa formatting circuit 36 is coupled to the format switch 42, which can be, for example, a knob, for simultaneous actuation with switch 60-62 of the ordinate format circuit 22.

The output of the abscissa format circuit 36 is transmitted through the abscissa scale expansion circuit 38 which includes a second set of frequency dividers 90, 92, 94, 96 and 98, any one of which can be independently and selectively placed in series between the abscissa format circuit 36 and the chart motor driver 40 by varying the position of switch 10. The switch position of switch 100 is shown as "1X" to provide the reference abscissa scale expansion. Other switch positions are designated "4X", "2X", "4X", "10X", and "20X". These designations would indicate the order of scale magnification on the abscissa which can be selected by an operator by utilization of switch 100.

Furthermore, while the clock 28 is described as having a fixed frequency, it is to be understood that the clock 28 may have a variable frequency when used for speed suppression as shown and described in the hereinabove mentioned related patent applications.

While scale expansion in the abscissa and scale expansion for the ordinate are known, the particular combination hereinabove described is especially unique inasmuch as it enables a user having a standard set of reference spectrograms previously recorded on another instrument to compare these spectrograms with unkown sample spectra recorded on an instrument utilizing the present invention by selection of the format desired by operating the format switch 42. The abscissa and ordinate scale expansion circuits then operate as scale expanders with respect to the selected format, are completely functionally independent of the format. Also by proper selection of resistors 66, 69 and 72 along with proper selection of the frequency dividers 80, 82, 84 and 86 any chart format utilized can be duplicated in accordance with the present invention.

It is also to be understood that the digital abscissa formatting which is independent of abscissa scale expansion circuitry as shown in FIG. 3 can be utilized independently of the analog ordinate formatting and vice versa. The switch 88 of FIG. 3, for example, can be on an instrument by itself to preselect an abscissa chart format for use with charts dimensioned in either metric or English units by appropriate selections of the frequency dividers within the abscissa format circuit 36. Similarly, the switch 60-62 shown in FIG. 2 can be utilized independently as a switch selectable calibrated range for use with charts dimensioned in both metric and English units independent of the scale expansion circuitry 12. Thus, the user has the option of using charts dimensioned in either metric or English units. Also, the format may take data at a fixed wavelength (in which case abscissa format is irrelevant) and still select ordinate format and scale expansion independently. Furthermore on a single instrument, a user can run spectrograms on a given sample on a large chart format for presentations or on a small chart format for notebooks or records.

Although the description has referred to X- and Y-axes or abscissa and ordinate it is to be understood that these terms are applicable to circular chart formats as well. While there has been shown and described a preferred embodiment, it is to be understood that various other adaptations and modifications may be made within the spirit and scope of the invention.

What is claimed is:

1. A spectrophotometer for measuring and recording an optical characteristic of a sample positioned in a radiant energy beam path comprising:

a first frequency responsive drive motor for driving a wavelength scanning mechanism in the radiant energy beam path to vary the wavelength output of the mechanism;

a chart recorder including a marker for recording on chart paper the optical characteristic of the sample as a function of the wavelength output of the mechanism to record a wavelength spectrum plot of the sample;

a second frequency responsive drive motor for driving the chart paper along an abscissa scale;

a third drive motor for driving the marker along an ordinate scale as a function of the optical characteristic of the sample;

means for synchronizing operation of the wavelength scanning mechanism and the chart recorder such that the position of the marker along the abscissa scale is a function of the wavelength output, the synchronizing means including a system clock having a pulse train output and means for coupling the clock output to the first and second frequency responsive motors for driving the same;

first variable frequency division means coupled between the output of the system clock and the first frequency responsive motor to vary the scanning speed of the wavelength scanning mechanism;

second variable frequency division means coupled between the system clock and the second frequency responsive motor for selecting one of several speeds at which the chart paper is driven relative to the marker along the abscissa scale and hence for selecting an abscissa scale expansion value;

third frequency division means independent of the second frequency division means and coupled between the system clock and the second frequency responsive motor, the third frequency division means having a plurality of preset operating conditions each establishing a different limit for the abscissa scale to define an abscissa scale format for the spectrophototmeter;

means for controlling the third drive motor and responsive to a signal indicative of the optical characteristic for establishing a predetermined fraction of the total range of optical characteristic values for recording over the entire ordinate scale to define a condition of ordinate scale expansion for the spectrophotometer;

means independent of the controlling means for establishing preselected maximum limits on travel of the marker along the ordinate scale to define different ordinate scale formats for the spectrophotometer; and means for actuating the third variable frequency division means and the establishing means to select predetermined combinations of ordinate and abscissa formats independent from selection of values of ordinate and abscissa scale expansion by the controlling means and the second variable frequency division means.

2. The analyzer of claim 1 wherein the actuating means is a mechanical connection simultaneously actuating the third variable frequency division means and the establishing means.

* * * * *